(12) United States Patent
Eihama

(10) Patent No.: US 10,938,377 B2
(45) Date of Patent: Mar. 2, 2021

(54) SURFACE ACOUSTIC WAVE RESONATOR, SURFACE ACOUSTIC WAVE FILTER, AND DUPLEXER

(71) Applicant: Murata Manufacturing Co., Ltd., Nagaokakyo (JP)

(72) Inventor: Toru Eihama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 25 days.

(21) Appl. No.: 16/435,619

(22) Filed: Jun. 10, 2019

(65) Prior Publication Data
US 2019/0296714 A1 Sep. 26, 2019

Related U.S. Application Data

(63) Continuation of application No. PCT/JP2017/045973, filed on Dec. 21, 2017.

(30) Foreign Application Priority Data

Dec. 22, 2016 (JP) ............................ JP2016-249026

(51) Int. Cl.
*H03H 9/145* (2006.01)
*H03H 9/64* (2006.01)
(Continued)

(52) U.S. Cl.
CPC ........ *H03H 9/145* (2013.01); *H03H 9/02535* (2013.01); *H03H 9/64* (2013.01);
(Continued)

(58) Field of Classification Search
CPC ...... H03H 9/02535; H03H 9/145; H03H 9/64; H03H 9/72
See application file for complete search history.

(56) References Cited

U.S. PATENT DOCUMENTS

| 5,864,262 A * | 1/1999 | Ikada | H03H 9/6436 |
| | | | 333/193 |
| 8,710,940 B2 * | 4/2014 | Sogoya | H03H 9/6483 |
| | | | 333/193 |

(Continued)

FOREIGN PATENT DOCUMENTS

| JP | 09-205343 A | 8/1997 |
| JP | 2011-172191 A | 9/2011 |

(Continued)

OTHER PUBLICATIONS

Official Communication issued in International Patent Application No. PCT/JP2017/045973 dated Mar. 6, 2018.
(Continued)

*Primary Examiner* — Dean O Takaoka
*Assistant Examiner* — Alan Wong
(74) *Attorney, Agent, or Firm* — Keating & Bennett, LLP

(57) ABSTRACT

A surface acoustic wave resonator includes first and second surface acoustic wave resonator connected in series, and a third surface acoustic wave resonator connected in series with the second surface acoustic wave resonator. Each of the first to third surface acoustic wave resonators includes a pair of comb-shaped electrodes in which electrode fingers of one of the comb-shaped electrodes and electrode fingers of the other one of the comb-shaped electrodes are alternately arranged. The second surface acoustic wave resonator has a lower ratio of a width of the electrode fingers to a pitch between the electrode fingers than the first and third surface acoustic wave resonators.

18 Claims, 4 Drawing Sheets

(51) Int. Cl.
*H03H 9/72* (2006.01)
*H03H 9/02* (2006.01)

(52) U.S. Cl.
CPC ............ *H03H 9/6433* (2013.01); *H03H 9/72* (2013.01); *H03H 9/725* (2013.01)

(56) References Cited

U.S. PATENT DOCUMENTS

| | | | |
|---|---|---|---|
| 9,019,040 B2 * | 4/2015 | Takamine | H03H 9/725 |
| | | | 333/133 |
| 9,247,351 B2 * | 1/2016 | Detlefsen | H03H 9/6493 |
| 9,712,319 B2 * | 7/2017 | Avanzi | H04L 9/0618 |
| 9,948,278 B2 * | 4/2018 | Okuda | H03H 9/725 |
| 10,097,158 B2 * | 10/2018 | Kaneda | H03H 9/6483 |
| 2013/0154763 A1 | 6/2013 | Takamine | |
| 2016/0112030 A1 | 4/2016 | Kaneda et al. | |

FOREIGN PATENT DOCUMENTS

| | | |
|---|---|---|
| JP | 2012-175315 A | 9/2012 |
| JP | 2014-033377 A | 2/2014 |
| JP | 2016-082570 A | 5/2016 |
| KR | 10-2016-0045018 A | 4/2016 |
| WO | 2012/032832 A1 | 3/2012 |

OTHER PUBLICATIONS

Official Communication issued in corresponding Korean Patent Application No. 10-2019-7014394, dated Jul. 31, 2020.

* cited by examiner

SURFACE ACOUSTIC WAVE RESONATOR, SURFACE ACOUSTIC WAVE FILTER, AND DUPLEXER

CROSS REFERENCE TO RELATED APPLICATIONS

This application claims the benefit of priority to Japanese Patent Application No. 2016-249026 filed on Dec. 22, 2016 and is a Continuation Application of PCT Application No. PCT/JP2017/045973 filed on Dec. 21, 2017. The entire contents of each application are hereby incorporated herein by reference.

BACKGROUND OF THE INVENTION

1. Field of the Invention

The present invention relates to surface acoustic wave resonators, surface acoustic wave filters, and duplexers, and, more particularly, to a surface acoustic wave filter including a plurality of surface acoustic wave resonators and a duplexer.

2. Description of the Related Art

As band pass filters or duplexers installed in radio frequency (RF) circuits in communication devices such as cellular phone devices, surface acoustic wave filters using surface acoustic waves (SAWs) have been used.

As an example of such a surface acoustic wave filter, a ladder filter is known in which a plurality of surface acoustic wave resonators are alternately connected in series with and in parallel to each other (see, for example, Japanese Unexamined Patent Application Publication No. 9-205343).

In the ladder filter, as each of the surface acoustic wave resonators, a one-port resonator including a pair of comb-shaped electrodes (hereinafter also referred to as "inter digital transducer (IDT) electrodes") is used. In Japanese Unexamined Patent Application Publication No. 9-205343, a resonator including the surface acoustic wave resonators connected in series with each other is used. That is, the resonator is divided into the surface acoustic wave resonators. At this resonator, mechanical stress concentration is easily caused by input power. In Japanese Unexamined Patent Application Publication No. 9-205343, by dispersing the mechanical stress concentrated at the resonator, the occurrence of migration is suppressed and the improvement of electric power handling capability is realized.

However, in the case of the configuration in which the resonator is divided into the surface acoustic wave resonators, the surface acoustic wave resonators may have different heat radiation properties. Because of this, the surface acoustic wave devices may experience different thermal stresses. Accordingly, at the surface acoustic wave resonator under a relatively large thermal stress as compared with the other surface acoustic wave resonators, it is probable that migration is heat-accelerates and a discharge breakdown occurs at an IDT electrode. As a result, the electric power handling capability of the whole of the surface acoustic wave filter is reduced.

SUMMARY OF THE INVENTION

Preferred embodiments of the present invention provide surface acoustic wave resonators, surface acoustic wave filters, and duplexers, each of which is capable of improving electric power handling capability.

A surface acoustic wave resonator according to a preferred embodiment of the present invention includes a first surface acoustic wave resonator, a second surface acoustic wave resonator connected in series with the first surface acoustic wave resonator, and a third surface acoustic wave resonator connected in series with the second surface acoustic wave resonator. Each of the first to third surface acoustic wave resonators includes a pair of comb-shaped electrodes in which a plurality of electrode fingers of one of the comb-shaped electrodes and a plurality of electrode fringes of the other one of the comb-shaped electrodes are alternately arranged along an acoustic wave propagation direction. The second surface acoustic wave resonator has a lower ratio of a width of the electrode fingers to a pitch between the electrode fingers than the first and third surface acoustic wave resonators.

A surface acoustic wave filter according to a preferred embodiment of the present invention includes a first signal terminal, a second signal terminal, and a ladder filter that is connected between the first signal terminal and the second signal terminal and includes a plurality of resonator groups. At least one of the resonator groups is defined by the above surface acoustic wave resonator.

In the above surface acoustic wave filter, the ladder filter preferably filters a signal input into the first signal terminal and output the signal to the second signal terminal. The resonator groups preferably include series arm resonators connected in series between the first signal terminal and the second signal terminal. One of the series arm resonators which is nearest to the first signal terminal preferably includes the first to third surface acoustic wave resonators.

A duplexer according to a preferred embodiment of the present invention includes a transmission filter including the above surface acoustic wave filter, a third signal terminal, and a reception filter connected between the third signal terminal and a node between the second signal terminal and the ladder filter.

With surface acoustic wave resonators, surface acoustic wave filters, and duplexers according to preferred embodiments of the present invention, electric power handling capability is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
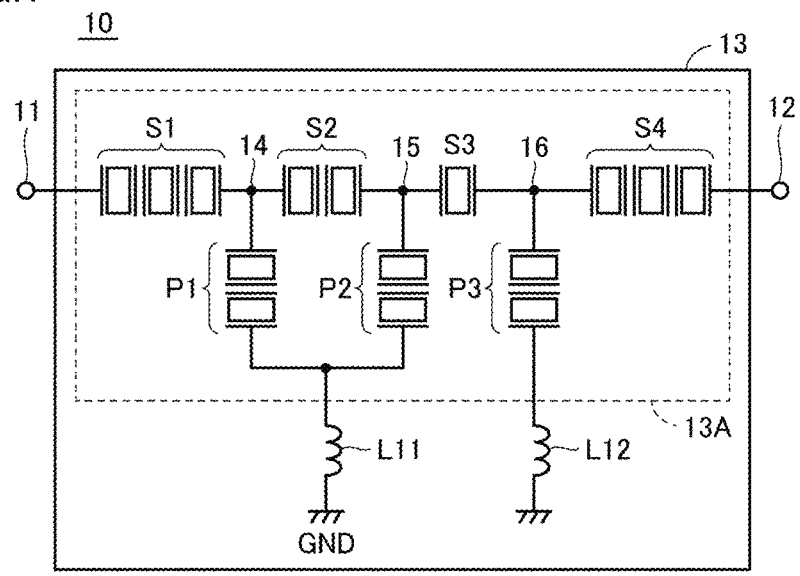
FIG. 1 is a diagram schematically illustrating the circuit configuration of a surface acoustic wave filter according to a preferred embodiment of the present invention.

Preferred embodiments of the present invention will be described below. The same reference numerals are used to identify the same components or equivalent components and the description of such components is not repeated.

When a number or a quantity is mentioned in the preferred embodiments to be described below, the scope of the present invention is not limited to the number or quantity unless otherwise specified. Furthermore, each component in the following preferred embodiments is not necessarily essential for the present invention unless otherwise specified.

FIG. 1 is a diagram schematically illustrating the circuit configuration of a surface acoustic wave filter according to a preferred embodiment of the present invention. A surface acoustic wave filter device 10 illustrated in FIG. 1 is installed in, for example, an RF circuit in a cellular phone.

The surface acoustic wave filter device 10 includes an input terminal 11, an output terminal 12, and a filter portion 13 connected between the input terminal 11 and the output terminal 12. The filter portion 13 is configured to filter a signal input into the input terminal 11 and output the signal to the output terminal 12. The input terminal 11 corresponds to a "first signal terminal", and the output terminal 12 corresponds to a "second signal terminal".

The filter portion 13 is a ladder surface acoustic wave filter. The filter portion 13 includes series arm resonators S1 to S4, parallel arm resonators P1 to P3, and inductors L11 and L12.

The series arm resonators S1 to S4 are connected in series between the input terminal 11 and the output terminal 12. Specifically, one of terminals of the series arm resonator S1 is connected to the input terminal 11, and the other one of the terminals of the series arm resonator S1 is connected to one of terminals of the series arm resonator S2. The other one of the terminals of the series arm resonator S2 is connected to one of terminals of the series arm resonator S3. The other one of the terminals of the series arm resonator S3 is connected to one of terminals of the series arm resonator S4. The other end of the terminals of the series arm resonator S4 is connected to the output terminal 12.

The parallel arm resonator P1 is electrically connected between a grounding wiring line GND and a node 14 between the series arm resonators S1 and S2. The parallel arm resonator P2 is electrically connected between the grounding wiring line GND and a node 15 between the series arm resonators S2 and S3. The parallel arm resonator P3 is electrically connected between the grounding wiring line GND and a node 16 between the series arm resonators S3 and S4.

Between each of the parallel arm resonators P1 and P2 and the grounding wiring line GND, the inductor L11 is connected. Between the parallel arm resonator P3 and the grounding wiring line GND, the inductor L12 is connected. In the filter portion 13, not only the inductors L11 and L12 but also an inductor, a capacitor, and a resistor may be disposed at appropriate positions.

The series arm resonators S1 to S4 and the parallel arm resonators P1 to P3 included in the filter portion 13 define a surface acoustic wave filter chip 13A. Although not illustrated, the surface acoustic wave filter chip 13A is mounted on the die-attach surface of a wiring board via bumps using a flip-chip method. The surface acoustic wave filter chip 13A is sealed by a resin. That is, the surface acoustic wave filter device 10 is a chip size package (CSP) surface acoustic wave filter.

Each of the series arm resonators S1 to S4 and the parallel arm resonators P1 to P3 is a one-port surface acoustic wave resonator. Each of the series arm resonators S1, S2, and S4 and the parallel arm resonators P1 to P3 has a configuration in which a plurality of one-port surface acoustic wave resonators are connected in series with each other. That is, a single resonator is divided into a plurality of divided resonators. By dividing a single resonator into a plurality of divided resonators, a mechanical stress caused at the time of excitation of a surface acoustic wave is able to be dispersed to the divided resonators. The number of times of division is two or three in the example illustrated in FIG. 1, but may be optionally set. The series arm resonators S1, S2, and S4 and the parallel arm resonators P1 to P3 correspond to an example of a "resonator group" including a plurality of divided resonators.

Figure 2:
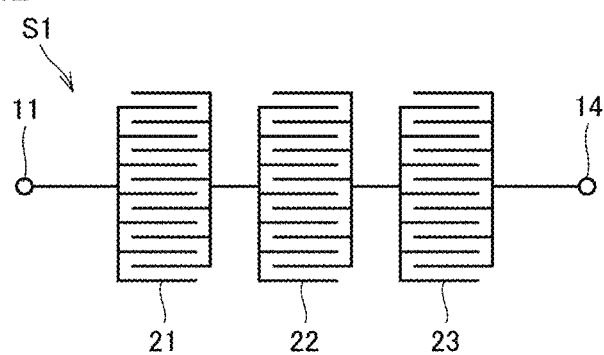
FIG. 2 is a diagram schematically illustrating the configuration of a series arm resonator illustrated in FIG. 1.

FIG. 2 is a diagram schematically illustrating the configuration of the series arm resonator S1 illustrated in FIG. 1. The configuration of the series arm resonator S4 is the same as that of the series arm resonator S1 except for particular design specifications, such as a dimension.

Referring to FIG. 2, the series arm resonator S1 includes three surface acoustic wave resonators 21 to 23. The first surface acoustic wave resonator 21 is electrically connected between the input terminal 11 and the node 14. The second surface acoustic wave resonator 22 is connected in series with the first surface acoustic wave resonator 21. The third surface acoustic wave resonator 23 is connected in series with the second surface acoustic wave resonator 22. That is, the first surface acoustic wave resonator 21 to the third surface acoustic wave resonator 23 are connected in series in this order between the input terminal and the node 14. That is, the series arm resonator S1 is divided into three divided resonators (the surface acoustic wave resonators 21 to 23).

The adjacent surface acoustic wave resonators are connected to each other via no branch circuit. A branch circuit is a circuit that branches off from a wiring line connecting adjacent surface acoustic wave resonators and includes a device having a predetermined function (for example, an inductor, a capacitor, a resistor, or a grounding wiring line) at a branch destination.

Figure 3:
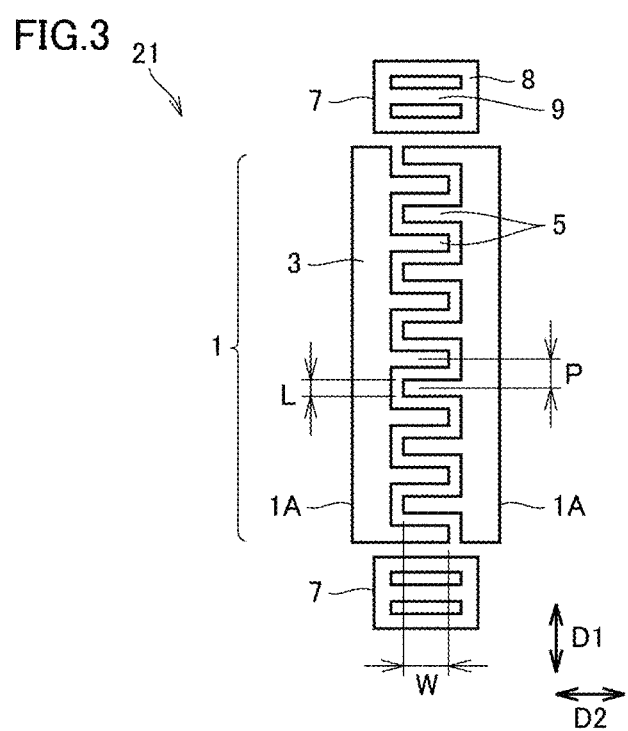
FIG. 3 is a schematic plan view of a surface acoustic wave resonator.

Each of the three surface acoustic wave resonators 21 to 23 is a one-port resonator. FIG. 3 is a schematic plan view of the first surface acoustic wave resonator 21. The configuration of each of the second surface acoustic wave resonators 22 and 23 is the same as that of the first surface acoustic wave resonator 21. Referring to FIG. 3, the first surface acoustic wave resonator 21 includes an IDT electrode 1 and two reflectors 7 located on either side of the IDT electrode 1. The IDT electrode 1 includes a pair of comb-shaped electrodes 1A.

Each of the pair of the comb-shaped electrodes 1A can be provided by forming on a piezoelectric substrate a single metal such as aluminum, copper, silver, gold, titanium, tungsten, platinum, chromium, nickel, or molybdenum or a metal layer made of an alloy mainly containing at least one of these metals. As the piezoelectric substrate, a substrate made of piezoelectric monocrystal such as $LiTaO_3$ or $LiNbO_3$ can be used. Instead of piezoelectric monocrystal, piezoelectric ceramics may be used. A piezoelectric substrate including a piezoelectric film laminated on a support substrate may be used. As the piezoelectric film, the piezoelectric monocrystal can be used as appropriate.

Each of the comb-shaped electrodes 1A includes a linearly extending busbar 3 and a plurality of electrode fingers 5 extending in a direction orthogonal to the longitudinal direction of the busbar 3. A pitch between the electrode fingers 5 is constant or substantially constant. The pair of comb-shaped electrodes 1A is located such that each of the electrode finger 5 in one of the comb-shaped electrodes 1A and corresponding one of the electrode fingers 5 in the other one of the comb-shaped electrode 1A are adjacent to each other.

When a voltage is applied to the IDT electrode 1, a surface acoustic wave having the pitch between the electrode fingers 5 as a half wavelength thereof and propagating in a direction in which the electrode fingers 5 are arranged is excited. The direction in which the electrode fingers 5 are arranged is hereinafter also referred to as a propagation direction D1, and a direction orthogonal to the propagation direction D1 is hereinafter also referred to as an orthogonal direction D2.

The two reflectors 7 are located on either side of the IDT electrode 1 in the propagation direction D1. Each of the reflectors 7 includes a pair of busbars 8 extending in the propagation direction and a plurality of electrode fingers 9 extending in the orthogonal direction D2 between the pair of the busbars 8. The pitch between the electrode fingers 9 and the distance between the reflector 7 and the IDT electrode 1 are the same or substantially the same as the pitch between the electrode fingers 5.

The surface acoustic wave that has propagated in the propagation direction D1 at the position where the IDT electrode 1 is disposed is reflected by the reflectors 7, so that standing waves are generated. As a result, high-Q resonance occurs. That is, the surface acoustic wave resonator functions as a high-Q resonator.

The characteristics of the surface acoustic wave resonators are specified on the basis of, for example, an electrode finger pitch P, an intersecting width W, the number of the electrode fingers 5, and an electrode ratio (duty). The electrode finger pitch P is the pitch between the electrode fingers 5, and is defined by, for example, the distance between the centers of the electrode fingers 5 in the pair of the comb-shaped electrodes 1A. The intersecting width W is the amount of overlap between the electrode fingers 5 interdigitating with each other in the orthogonal direction D2. The electrode ratio is the ratio (L/P) of a width L of the electrode finger 5 to the electrode finger pitch P.

In order to evenly disperse mechanical stress to the three surface acoustic wave resonators 21 to 23 in the series arm resonator, they typically have the same configuration. Specifically, in the surface acoustic wave resonators 21 to 23, the same electrode finger pitch P, the same intersecting width W, the same number of the electrode fingers 5, and the same electrode ratio are set.

However, in the case of the configuration in which the three surface acoustic wave resonators 21 to 23 are arranged in a line (see FIG. 4), the surface acoustic wave resonators experience different thermal stresses. The reason for this is that the second surface acoustic wave resonator 22 sandwiched between the first surface acoustic wave resonator 21 and the third surface acoustic wave resonator 23 is less likely to radiate heat than the first surface acoustic wave resonator 21 and the third surface acoustic wave resonator 23. Accordingly, the second surface acoustic wave resonator 22 is more likely to cause the increase in temperature than the first surface acoustic wave resonator 21 and the third surface acoustic wave resonator 23.

At the second surface acoustic wave resonator 22, migration may therefore accelerate under the influence of thermal stress. Specifically, when a mechanical stress occurs at the IDT electrode 1, migration may occur in which Al atoms contained in the IDT electrode 1 move along the crystalline grain boundaries. At the second surface acoustic wave resonator 22, migration is more likely to occur because of heat-accelerated migration.

When migration occurs at the IDT electrode 1, the isolation between the pair of the comb-shaped electrodes 1A is reduced. As a result, a discharge breakdown may occur at the IDT electrode 1. In addition, at the IDT electrode 1, hillocks and voids may be generated. This leads to the reduction in the electric power handling capability of whole of the surface acoustic wave filter device 10.

The operation frequency of, for example, cellular phones has shifted toward higher frequencies, and the shift toward higher operation frequencies is therefore needed for surface acoustic wave filters included in RF circuits. In order to realize the higher operation frequency of a surface acoustic wave filter, the narrowing of the electrode finger pitch P of the IDT electrode 1 is effective. However, the narrower the electrode finger pitch P, the narrower the distance between the adjacent electrode fingers 5. Accordingly, a discharge breakdown due to migration is more likely to occur. The spacing between the adjacent electrode fingers 5 is represented by P-L.

In this preferred embodiment, the electrode ratio of the second surface acoustic wave resonator 22 is made lower than that of the first surface acoustic wave resonator 21 and the third surface acoustic wave resonator 23. As a result, as illustrated in FIG. 4, the spacing P-L between the adjacent electrode fingers 5 differs in the surface acoustic wave resonators 21 to 23.

Figure 4:
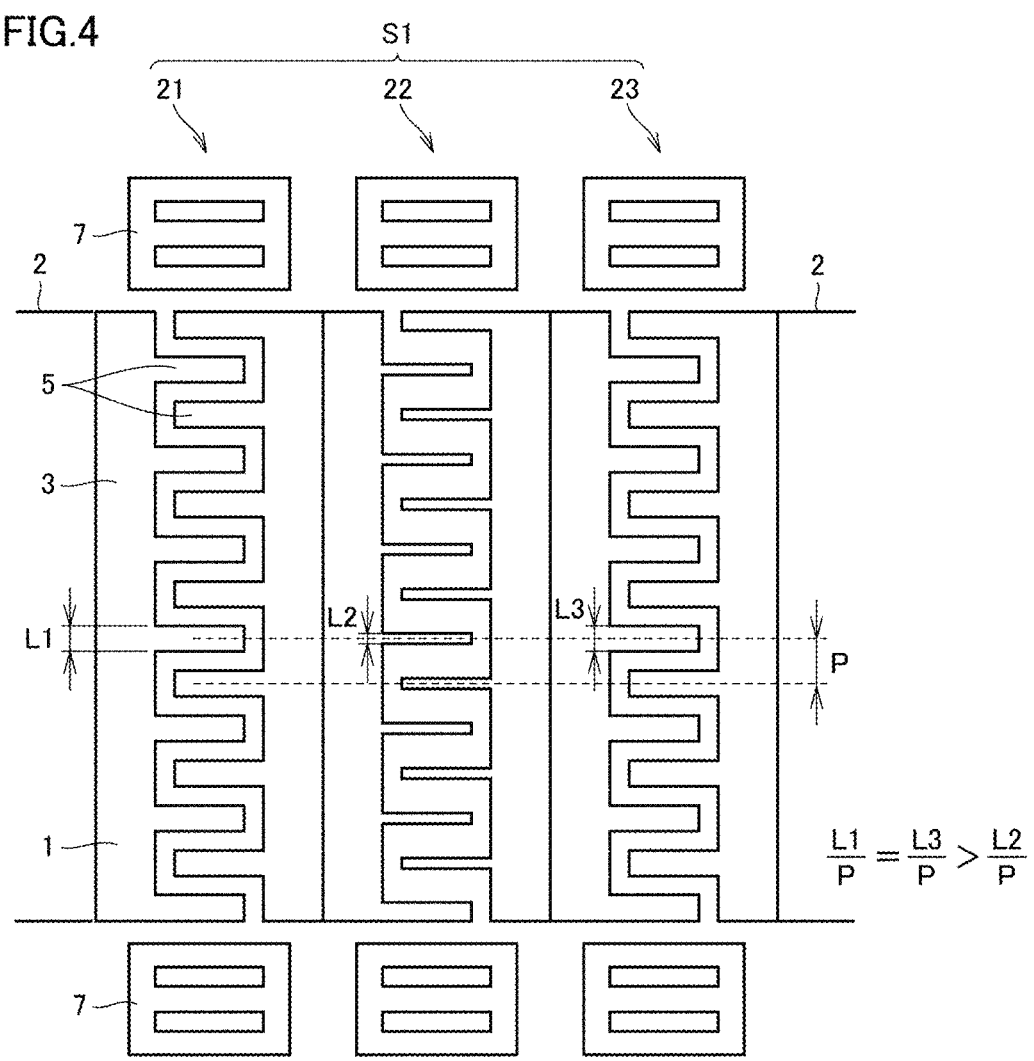
FIG. 4 is a schematic plan view of the series arm resonator illustrated in FIG. 2.

FIG. 4 is a schematic plan view of the series arm resonator S1 illustrated in FIG. 2. Referring to FIG. 4, the three surface acoustic wave resonators 21, 22 and 23 are arranged along the orthogonal direction D2. In the three second surface acoustic wave resonators 21, 22 and 23, the same size and the same position of the propagation direction D1 are set.

The adjacent surface acoustic wave resonators are connected to each other by connecting the busbars 3 in them. The connection between the busbars 3 is performed along the entire longitudinal direction of the busbars 3. The busbars 3 may be directly connected to each other as illustrated in FIG. 4, or may be indirectly connected to each other via a wiring line.

Each of the first surface acoustic wave resonator 21 and the third surface acoustic wave resonator 23 is connected to a wiring line 2. This connection is performed along the entire longitudinal direction of the busbar 3. As a result, heat is easily transmitted from each of the first surface acoustic wave resonator 21 and the third surface acoustic wave resonator 23 to the wiring line 2.

In the first surface acoustic wave resonator 21, the electrode ratio is represented by L1/P where L1 represents the electrode finger width of the IDT electrode 1. In the second surface acoustic wave resonator 22, the electrode ratio is represented by L2/P where L2 represents the electrode finger width of the IDT electrode 1. In the third surface acoustic wave resonator 23, the electrode ratio is represented by L3/P where L3 represents the electrode finger width of the IDT electrode 1.

In the first surface acoustic wave resonator 21 and the third surface acoustic wave resonator 23, the same size of the electrode finger 5 is set (L1=L3). Accordingly, the electrode ratio L1/P and the electrode ratio L3/P are equal to each other.

In this preferred embodiment, the electrode ratio L2/P of the second surface acoustic wave resonator 22 is made lower than the electrode ratio L1/P of the first surface acoustic wave resonator 21 and the electrode ratio L3/P of the third surface acoustic wave resonator 23.

Since the same electrode finger pitch P is set in the three surface acoustic wave resonators 21 to 23, a width L of the electrode finger 5 in the second surface acoustic wave resonator 22 becomes narrower than that in the first surface acoustic wave resonator 21 and the third surface acoustic wave resonator 23 (L2<L1=L3). Accordingly, the spacing P-L between the two adjacent electrode fingers 5 in the IDT electrode 1 in the second surface acoustic wave resonator 22 becomes wider than that in the first surface acoustic wave resonator 21 and the third surface acoustic wave resonator 23.

By setting the spacing P-L between the adjacent electrode fingers 5 in the second surface acoustic wave resonator 22 relatively wider than that in the first surface acoustic wave resonator 21 and the third surface acoustic wave resonator 23, a shot circuit is less likely to occur and the relatively high resistance to migration can be realized. As a result, the occurrence of the discharge breakdown of the IDT electrode 1 due to the thermal stress is able to be reduced or prevented and the electric power handling capability of the whole of the surface acoustic wave filter device 10 is able to be increased.

Since the width L of the electrode fingers 5 in the second surface acoustic wave resonator 22 is made relatively narrow, the electrostatic capacitance of the second surface acoustic wave resonator 22 becomes smaller than that of the first surface acoustic wave resonator 21 and the third surface acoustic wave resonator 23. When the electrostatic capacitance of one of the surface acoustic wave resonators 21 to 23 becomes relatively small as compared with the electrostatic capacitances of the other two of the surface acoustic wave resonators 21 to 23, the divided voltage of the one of them may become relatively high as compared with the divided voltages of the other two of them and the power consumption of the one of them may be relatively large as compared with the power consumptions of the other two of them. In order to equalize the electrostatic capacitances of the surface acoustic wave resonators 21 to 23, a method of making the intersecting width W relatively wide in the second surface acoustic wave resonator 22, a method of making the number of the electrode fingers 5 relatively large, or the combination of these methods is able to be used. As a result, the electric power handling capability of the surface acoustic wave filter device 10 is able to be increased without exerting an influence on the filter characteristics of the surface acoustic wave filter device 10.

In the second surface acoustic wave resonator 22, by making the width L of the electrode fingers 5 in the IDT electrode 1 relatively narrow, the resistance of the electrode fingers 5 becomes relatively high and the insertion loss of the second surface acoustic wave resonator 22 may become larger than that of the first surface acoustic wave resonator 21 and the third surface acoustic wave resonator 23. In order to equalize the resistances of the electrode fingers 5 in the surface acoustic wave resonators 21 to 23, the electrode film thickness of the second surface acoustic wave resonator 22 is able to be increased. As a result, the electric power handling capability of the surface acoustic wave filter device 10 is able to be increased without exerting an influence on the transmission characteristics of the surface acoustic wave filter device 10. In this case, although the frequency changes with the change in the electrode ratio, the frequency is able to be adjusted by adjusting the pitch.

In the surface acoustic wave filter device 10 illustrated in FIG. 1, when power is applied to the input terminal 11, a mechanical stress is intensively applied to the series arm resonator S1 at the first stage which is nearest to the input terminal 11. Of the three surface acoustic wave resonators 21 to 23 included in the series arm resonator S1, the second surface acoustic wave resonator 22 is most likely to be subjected to a discharge breakdown because of the synergistic effect of the mechanical stress and the thermal stress.

According to this preferred embodiment, in the series arm resonator S1, the electrode ratio of the second surface acoustic wave resonator 22 can be lower than that of the first surface acoustic wave resonators 21 and the third surface acoustic wave resonator 23 as illustrated in FIG. 4. This reduces or prevents the occurrence of a discharge breakdown at the second surface acoustic wave resonator 22. Accordingly, the electric power handling capability of the whole of the surface acoustic wave filter device 10 is able to be increased. Thus, it is desirable that the configuration in which the electrode ratio of the second surface acoustic wave resonator 22 is made lower than that of the first surface acoustic wave resonator 21 and the third surface acoustic wave resonator 23 be applied to the series arm resonator S1 at the input-side first stage.

Figure 5:
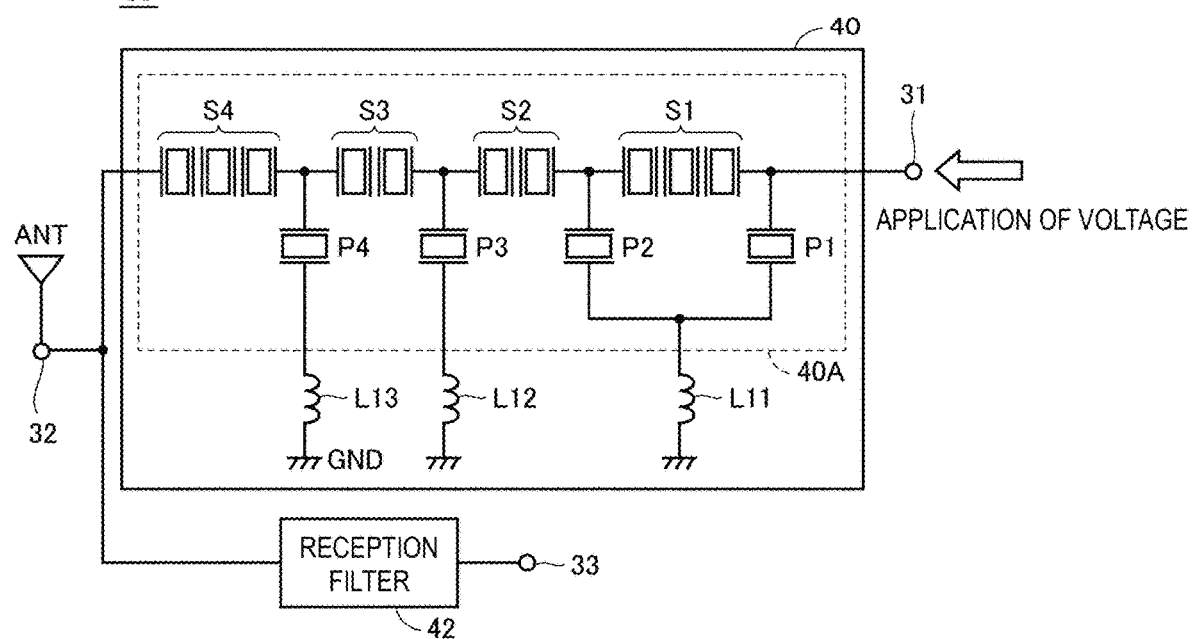
FIG. 5 is a diagram schematically illustrating the circuit configuration of a duplexer including a surface acoustic wave filter according to a preferred embodiment of the present invention.

FIG. 5 is a diagram schematically illustrating the circuit configuration of a duplexer including a surface acoustic wave filter according to a preferred embodiment of the present invention. Referring to FIG. 5, a duplexer 30 includes a transmission filter 40, a reception filter 42, a transmission terminal 31, an antenna terminal 32 connected to an antenna ANT, and a reception terminal 33. The transmission terminal 31 corresponds to the "first signal terminal", the antenna terminal 32 corresponds to the "second signal terminal", and the reception terminal 33 corresponds to a "third signal terminal".

The transmission filter 40 is connected between the antenna terminal 32 and the transmission terminal 31. The transmission filter 40 is configured to filter a signal input into the transmission terminal 31 and output the signal to the antenna terminal 32. The reception filter 42 is connected between the reception terminal 33 and a node between the antenna terminal 32 and the transmission filter 40. The reception filter 42 is configured to filter a signal input into the antenna terminal 32 and output the signal to the reception terminal 33.

The transmission filter 40 is a ladder surface acoustic wave filter. The transmission filter 40 includes the series arm resonators S1 to S4, the parallel arm resonators P1 to P3, a parallel arm resonator P4, the inductors L11 and L12, and an inductor L13. Each of the series arm resonators S1 to S4 and the parallel arm resonators P1 to P4 preferably is defined by the one-port surface acoustic wave resonator illustrated in FIG. 3. Each of the series arm resonators S1 to S4 preferably includes a plurality of one-port surface acoustic wave resonators connected in series with each other. The series arm resonators S1 to S4 and the parallel arm resonators P1 to P4 define a surface acoustic wave filter chip 40A.

The reception filter 42 is, for example, a balanced longitudinally coupled resonator-type surface acoustic wave filter having a balanced-unbalanced transforming function. The reception filter 42 may be formed integrally with the transmission filter 40 at the surface acoustic wave filter chip 40A. Alternatively, the surface acoustic wave filter chip 40A where the transmission filter 40 is disposed and a surface acoustic wave filter chip where the reception filter 42 is disposed may be separately provided.

In the duplexer 30, a large amount of power is typically applied to the transmission filter 40 in an RF circuit in a communication device. A ladder surface acoustic wave filter used as the transmission filter 40 therefore needs to have an excellent electric power handling capability.

It is desirable that the configuration in which the electrode ratio of the second surface acoustic wave resonator is made lower than that of the first and third surface acoustic wave resonators be applied to the transmission filter 40. Specifically, by making the electrode ratio of the second surface acoustic wave resonator lower than that of the first and third surface acoustic wave resonators in each of the series arm resonators S1 and S4, the second surface acoustic wave resonator has higher migration resistance than that the first and third surface acoustic wave resonators have. As a result, the occurrence of a discharge breakdown due to a thermal stress is suppressed at the second surface acoustic wave resonator and the electric power handling capability of the whole of the transmission filter is able to be increased.

More preferably, the configuration in which the electrode ratio of the second surface acoustic wave resonator is made lower than that of the first and third surface acoustic wave resonators can be applied to the series arm resonator S1 at the first stage which is nearest to the transmission terminal 31. In a case where a large amount of power is applied to the transmission terminal 31, a mechanical stress is intensively applied to the series arm resonator S1 at the first stage. The second surface acoustic wave resonator in the series arm resonator S1 is therefore more likely to cause the increase in temperature. According to this preferred embodiment, since the occurrence of a discharge breakdown due to a thermal stress is reduced or prevented at the second surface acoustic wave resonator, the electric power handling capability of the whole of the transmission filter 40 is able to be increased.

An inventor conducted an experiment to confirm the operational effect of a preferred embodiment of the present invention. In the experiment, accelerated life tests were conducted for each preferred embodiment and each comparative example.

As a duplexer according to a preferred embodiment and a duplexer that is a comparative example, a duplexer having the circuit configuration illustrated in FIG. 5 was used and the transmission frequency band of the duplexer was set to the 1.7 GHz band. In a preferred embodiment, the electrode ratios of the three surface acoustic wave resonators in the series arm resonator S1 at the first stage in the transmission filter were set as follows.

$$L1/P:L2/P:L3/P=1:0.91:1$$

In a comparative example, the electrode ratios of the three surface acoustic wave resonators were made equal to each other.

$$L1/P:L2/P:L3/P=1:1:1$$

For surface acoustic wave resonators of each of the series arm resonators and the parallel arm resonators, parameters (for example, the electrode finger pitch P, the intersecting width W, and the number of the electrode fingers 5) other than the electrode ratio L/P were set to the same values in a preferred embodiment and a comparative example.

Results of the accelerated life tests conducted under the same test conditions (for example, the input of 1.1 W and the ambient temperature of 110° C.) showed that the time period from the start of evaluation to the occurrence of a failure in a preferred embodiment was approximately 1.7 times longer than that in a comparative example. It was confirmed that the estimated time in a preferred embodiment was also approximately 1.7 times longer than that in a comparative example. On the basis of the results of the tests, it was confirmed that the electric power handling capability could be increased by making the electrode ratio of the second surface acoustic wave resonator lower than that of the first and third surface acoustic wave resonators.

The exemplary case in which a duplexer includes a surface acoustic wave filter according to this preferred embodiment has been described above. However, a surface acoustic wave filter according to this preferred embodiment may be used not only in a duplexer but also in any branching filter, such as a triplexer, a multiplexer, or a diplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave resonator comprising:
   a first surface acoustic wave resonator;
   a second surface acoustic wave resonator connected in series with the first surface acoustic wave resonator; and
   a third surface acoustic wave resonator connected in series with the second surface acoustic wave resonator; wherein
   each of the first, second and third surface acoustic wave resonators at least partially defines the surface acoustic wave resonator;
   the first, second and third surface acoustic wave resonators are connected in series in that order;
   each of the first, second and third surface acoustic wave resonators includes a pair of comb-shaped electrodes in which a plurality of electrode fingers of one of the comb-shaped electrodes and a plurality of electrode fringes of the other one of the comb-shaped electrodes are alternately arranged along an acoustic wave propagation direction; and
   the second surface acoustic wave resonator has a lower ratio of a width of the electrode fingers to a pitch between the electrode fingers than the first and third surface acoustic wave resonators.

2. The surface acoustic wave resonator according to claim 1, wherein each of the first, second and third surface acoustic wave resonators is a one-port resonator.

3. The surface acoustic wave resonator according to claim 1, wherein each of the first, second and third surface acoustic wave resonators includes reflectors located on either side of the pair of comb-shaped electrodes.

4. The surface acoustic wave resonator according to claim 1, wherein each of the first, second and third surface acoustic wave resonators have a same configuration.

5. The surface acoustic wave resonator according to claim 1, wherein at least two of the first, second and third surface acoustic wave resonators have at least one of a same electrode finger pitch, a same intersecting width, a same number of the electrode fingers, and a same electrode ratio.

6. The surface acoustic wave resonator according to claim 1, further comprising a wiring line connected to the first surface acoustic wave resonator and the third surface acoustic wave resonator.

7. The surface acoustic wave resonator according to claim 1, wherein the electrode fingers of the first surface acoustic wave resonator and the third surface acoustic wave resonator have a same size.

8. The surface acoustic wave resonator according to claim 1, wherein each of the first, second and third surface acoustic wave resonators have a same electrode finger pitch.

9. The surface acoustic wave resonator according to claim 1, wherein a width of the electrode finger of the second surface acoustic wave resonator is less than that of each of the first surface acoustic wave resonator and third surface acoustic wave resonator.

10. The surface acoustic wave resonator according to claim 1, wherein a space between the electrode fingers of the second surface acoustic wave resonator is greater than that of each of the first surface acoustic wave resonator and third surface acoustic wave resonator.

11. The surface acoustic wave resonator according to claim 1, wherein an electrostatic capacitance of the electrode finger of the second surface acoustic wave resonator is less than that of each of the first surface acoustic wave resonator and third surface acoustic wave resonator.

12. A surface acoustic wave filter comprising:
a first signal terminal;
a second signal terminal; and
a ladder filter that is connected between the first signal terminal and the second signal terminal and includes a plurality of resonator groups; wherein
at least one of the resonator groups is defined by the surface acoustic wave resonator according to claim 1.

13. The surface acoustic wave filter according to claim 12, wherein
the ladder filter filters a signal input to the first signal terminal and outputs the signal to the second signal terminal;
the resonator groups include series arm resonators connected in series between the first signal terminal and the second signal terminal; and
one of the series arm resonators which is nearest to the first signal terminal includes the first, second, and third surface acoustic wave resonators.

14. The surface acoustic wave filter according to claim 12, further comprising inductors connected to at least one of the resonator groups.

15. The surface acoustic wave filter according to claim 12, wherein the resonator groups include series arm resonators and parallel arm resonators defining a surface acoustic wave filter chip.

16. The surface acoustic wave filter according to claim 12, wherein the resonator groups include series arm resonators and parallel arm resonators each including a plurality of one-port surface acoustic wave resonators connected in series with each other.

17. A duplexer comprising:
a transmission filter including the surface acoustic wave filter according to claim 12;
a third signal terminal; and
a reception filter connected between the third signal terminal and a node between the second signal terminal and the ladder filter.

18. An RF circuit for a cellular phone comprising the surface acoustic wave filter according to claim 12.

* * * * *